US011313809B1

(12) United States Patent
Pandev et al.

(10) Patent No.: US 11,313,809 B1
(45) Date of Patent: Apr. 26, 2022

(54) PROCESS CONTROL METROLOGY

(71) Applicant: KLA-Tencor Corporation, Milpitas, CA (US)

(72) Inventors: Stilian Ivanov Pandev, Santa Clara, CA (US); Wei Lu, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/587,297

(22) Filed: May 4, 2017

Related U.S. Application Data

(60) Provisional application No. 62/331,955, filed on May 4, 2016.

(51) Int. Cl.
  *G01N 21/95* (2006.01)
  *H01L 21/66* (2006.01)
  *H01L 21/67* (2006.01)

(52) U.S. Cl.
  CPC ..... *G01N 21/9501* (2013.01); *H01L 21/67288* (2013.01); *H01L 22/12* (2013.01)

(58) Field of Classification Search
  CPC .......... G01N 21/9501; G01N 21/4785; G01N 2021/8887; G01N 21/8851; G01N 2021/95615; G01N 21/274; G01N 21/278; G01N 21/956; G01N 21/47; H01L 21/67288; H01L 22/12; H01L 2924/00; H01L 21/308; H01L 21/68; G03F 7/70633; G03F 7/70683; G03F 7/705; G03F 7/70625; G03F 7/70508; G03F 7/70516; G03F 7/70641; G01B 11/272
  See application file for complete search history.

(56) References Cited

U.S. PATENT DOCUMENTS

| | | | | |
|---|---|---|---|---|
| 4,443,278 | A | * | 4/1984 | Zingher ............ H01L 21/67276 156/379 |
| 4,578,279 | A | * | 3/1986 | Zingher ............ H01L 21/67288 427/10 |
| 5,608,526 | A | | 3/1997 | Piwonka-Corle et al. |
| 5,859,424 | A | | 1/1999 | Norton et al. |
| | | | | (Continued) |

*Primary Examiner* — Mohamed K Amara
(74) *Attorney, Agent, or Firm* — Spano Law Group; Joseph S. Spano

(57) ABSTRACT

Methods and systems for estimating values of process parameters based on measurements of structures fabricated on a product wafer are presented herein. Exemplary process parameters include lithography dosage and exposure and lithography scanner aberrations. A measurement model is employed to estimate process parameter values from measurements of structures fabricated on a wafer by a particular fabrication process. The measurement model includes process parameters and geometric parameters of structures under measurement. In some embodiments, a model based regression of both a process model and a metrology model is employed to arrive at estimates of at least one process parameter value based on measurements of a fabricated structure. In some embodiments, a trained measurement model is employed to directly estimate process parameter values based on measurements of structures. The measurement model is trained based on simulated measurement signals associated with measurements of shape profiles generated by different sets of process parameter values.

19 Claims, 9 Drawing Sheets

(56) References Cited

U.S. PATENT DOCUMENTS

| | | | |
|---|---|---|---|
| 5,962,172 A * | 10/1999 | Nakao | G03F 7/70433 430/5 |
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,768,967 B2 * | 7/2004 | Johnson | G01N 21/4788 702/179 |
| 6,816,570 B2 | 10/2004 | Janik et al. | |
| 6,813,034 B2 * | 11/2004 | Rosencwaig | G01B 11/00 250/237 G |
| 6,895,075 B2 | 5/2005 | Yokhin et al. | |
| 6,972,852 B2 | 12/2005 | Opsal et al. | |
| 7,046,376 B2 * | 5/2006 | Sezginer | G01B 11/0616 356/601 |
| 7,110,099 B2 * | 9/2006 | Littau | G03F 7/70491 356/124 |
| 7,283,237 B2 * | 10/2007 | Sezginer | G01B 11/0616 356/401 |
| 7,352,453 B2 * | 4/2008 | Mieher | G01N 21/956 356/125 |
| 7,382,447 B2 * | 6/2008 | Mieher | G03F 7/70625 356/124 |
| 7,385,699 B2 * | 6/2008 | Mieher | G03F 9/7049 356/401 |
| 7,478,019 B2 | 1/2009 | Zangooie et al. | |
| 7,502,101 B2 * | 3/2009 | Raymond | G01B 11/0616 356/237.1 |
| 7,511,265 B2 * | 3/2009 | Walsh | G01N 21/274 250/252.1 |
| 7,515,279 B2 * | 4/2009 | Raymond | G01B 11/00 356/237.5 |
| 7,715,019 B2 * | 5/2010 | Kiers | G03F 7/70625 356/303 |
| 7,719,677 B2 * | 5/2010 | Rosengaus | G01J 3/02 356/300 |
| 7,804,059 B2 * | 9/2010 | Harrison | G01N 21/274 250/252.1 |
| 7,826,071 B2 | 11/2010 | Shchegrov et al. | |
| 7,921,383 B1 * | 4/2011 | Wei | G03F 7/705 703/13 |
| 7,929,667 B1 | 4/2011 | Zhuang et al. | |
| 7,933,026 B2 * | 4/2011 | Opsal | G01B 11/0641 356/237.2 |
| 8,843,875 B2 | 9/2014 | Pandev | |
| 9,383,661 B2 * | 7/2016 | Pandev | G03F 9/7026 |
| 9,710,728 B2 * | 7/2017 | Pandev | G06K 9/4604 |
| 9,739,719 B2 * | 8/2017 | Fu | G01B 11/0616 |
| 9,823,586 B2 * | 11/2017 | Quintanilha | G03F 1/24 |
| 9,921,104 B2 * | 3/2018 | Krishnan | G01J 3/189 |
| 9,921,152 B2 * | 3/2018 | Krishnan | G01N 21/3563 |
| 10,041,873 B2 * | 8/2018 | Krishnan | G01B 11/12 |
| 10,072,921 B2 * | 9/2018 | Fu | G01B 11/24 |
| 10,101,676 B2 * | 10/2018 | Fu | G03F 9/7065 |
| 10,132,684 B1 * | 11/2018 | Van Derslice | G01J 3/42 |
| 10,133,192 B2 * | 11/2018 | Tinnemans | G01N 21/95607 |
| 10,151,986 B2 * | 12/2018 | Shchegrov | G03F 7/705 |
| 10,210,606 B2 * | 2/2019 | Pandev | G06T 7/001 |
| 10,215,693 B2 * | 2/2019 | Krishnan | G01B 11/28 |
| 10,281,263 B2 * | 5/2019 | Krishnan | G01N 21/00 |
| 10,324,050 B2 * | 6/2019 | Hench | G01N 23/20008 |
| 10,352,876 B2 * | 7/2019 | Shchegrov | G01N 21/9501 |
| 2002/0006677 A1 * | 1/2002 | Egermeier | H01L 22/20 438/14 |
| 2002/0158193 A1 * | 10/2002 | Sezginer | G03F 7/70633 250/237 G |
| 2003/0187604 A1 * | 10/2003 | Drege | G01N 21/956 702/119 |
| 2004/0233445 A1 * | 11/2004 | Littau | G01N 21/4788 356/401 |
| 2004/0267490 A1 * | 12/2004 | Opsal | G03F 7/70625 702/127 |
| 2005/0185174 A1 * | 8/2005 | Laan | G01N 21/4788 356/243.1 |
| 2005/0240895 A1 * | 10/2005 | Smith | G03F 7/705 700/121 |
| 2005/0251350 A1 * | 11/2005 | Opsal | G03F 7/70625 702/27 |
| 2006/0065625 A1 * | 3/2006 | Abdulhalim | H01L 22/12 216/59 |
| 2006/0289790 A1 * | 12/2006 | Raymond | G01B 11/0616 250/459.1 |
| 2007/0035712 A1 * | 2/2007 | Gassner | G03F 7/70641 355/55 |
| 2007/0222979 A1 * | 9/2007 | Van Der Laan | G03F 7/705 356/243.1 |
| 2008/0007739 A1 * | 1/2008 | Vuong | G01B 11/24 356/625 |
| 2008/0009081 A1 * | 1/2008 | Madriaga | G01B 11/14 438/16 |
| 2008/0117434 A1 * | 5/2008 | Verstappen | G01B 11/24 356/521 |
| 2009/0237676 A1 * | 9/2009 | Kiers | G03F 7/70625 356/601 |
| 2010/0280812 A1 * | 11/2010 | Zhang | G03F 7/70625 703/13 |
| 2011/0019207 A1 * | 1/2011 | Licitra | G01N 21/211 356/625 |
| 2012/0123748 A1 * | 5/2012 | Aben | G03F 7/70483 703/2 |
| 2013/0114085 A1 | 5/2013 | Wang et al. | |
| 2013/0215404 A1 * | 8/2013 | Den Boef | G01J 3/4412 355/44 |
| 2014/0111791 A1 | 10/2013 | Manassen et al. | |
| 2014/0172394 A1 * | 6/2014 | Kuznetsov | G03F 7/70641 703/6 |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2015/0042984 A1 | 2/2015 | Pandev et al. | |
| 2015/0046118 A1 * | 2/2015 | Pandev | H01L 22/12 702/155 |
| 2015/0204664 A1 * | 7/2015 | Bringoltz | G03F 7/70683 356/492 |
| 2015/0346605 A1 * | 12/2015 | Den Boef | G03F 7/705 438/401 |
| 2016/0203945 A1 * | 7/2016 | Foucher | G03F 7/70625 250/252.1 |

\* cited by examiner

PROCESS CONTROL METROLOGY

CROSS REFERENCE TO RELATED APPLICATION

The present application for patent claims priority under 35 U.S.C. § 119 from U.S. provisional patent application Ser. No. 62/331,955, entitled "Process Control Metrology," filed May 4, 2016, the subject matter of which is incorporated herein by reference in its entirety.

TECHNICAL FIELD

The described embodiments relate to metrology systems and methods, and more particularly to methods and systems for improved measurement of structures fabricated in the semiconductor industry.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry, ellisometry, and reflectometry implementations and associated analysis algorithms are commonly used to characterize critical dimensions, film thicknesses, composition, overlay and other parameters of nanoscale structures.

In some examples, optical critical dimension (CD) and film metrologies (spectroscopic or angle-resolved) are employed to monitor structural parameter values during manufacture to ensure that structures are fabricated having the desired pitch and profile. In many examples, process parameters directly influence the structural parameter values under measurement, and it is desirable to estimate and correct process parameter values from measurements of the fabricated structure.

In some examples, process parameter values are determined indirectly by measuring structural parameters, and then correlating these measurements to process parameter values. Unfortunately, it is often very difficult or impossible to predict the relationship between measured geometric parameters and process parameters.

In some other examples, process parameter values are determined directly from measurements of structural parameters based on a mapping between process parameter values and structural parameter values established by a Design Of Experiments (DOE) wafer. The DOE wafer is fabricated with different, known process parameter settings at different locations on the wafer. Measurements of the structures fabricated at each different location form the basis for the mapping between known process parameter values and measured structural parameter values. Unfortunately, the process window captured using this approach is very limited. Thus, it is very difficult or impossible to fabricate a set of DOE wafers that spans a sufficiently large process range for practical semiconductor measurement applications. In addition, the process parameter values employed to fabricate the DOE wafers include significant uncertainties that limit the accuracy of process parameter measurements employing this approach.

Future metrology applications present challenges for metrology due to increasingly small resolution requirements, multi-parameter correlation, increasingly complex geometric structures, and increasing use of opaque materials. Thus, methods and systems for improved measurements of process parameters are desired.

SUMMARY

Methods and systems for estimating values of process parameters based on measurements of structures fabricated on a product wafer are presented herein. Exemplary process parameters include lithography dosage and exposure and lithography scanner aberrations. The measurements are in-line measurements performed quickly and with sufficient accuracy to enable yield improvement of an on-going semiconductor fabrication process flow.

In one aspect, a measurement model including process parameters and geometric parameters of structures under measurement is employed to estimate process parameter values from measurements of structures fabricated on a wafer by a particular fabrication process.

In some embodiments, a model based regression of both a process model and a metrology model is employed to arrive at estimates of at least one process parameter value based on measurements of a fabricated structure. The process and metrology models describe the sensitivity of both process parameters and geometric parameters of underlayers, films, buried structures, etc., on metrology signals generated by a particular metrology system. A regression based optimization tunes all process parameters and geometric parameters concurrently to estimate shape profiles of the structure under consideration such that simulated measurement signals from a particular metrology system best match actual measured signals from the same metrology system.

In some embodiments, a trained measurement model is employed to directly estimate process parameter values based on measurements of structures. The measurement model is trained based on simulated measurement signals associated with measurements of shape profiles of a structure under consideration. The shape profiles are simulated by a process simulator for different sets of process parameter values that span a Design Of Experiments (DOE) parameter space. In general, the DOE parameter space spans the range of possible process parameter values likely to be encountered in an actual fabrication scenario.

In a further aspect, a transformation model is employed to reduce a dimension of the simulated measurement signal data. The transformation model maps the measurement signals to a new reduced set of signals. This reduced computational complexity significantly.

In another further aspect, a reduced order transformation model is trained to establish a mapping between a set of measured signals associated with a full range of process parameters and a reduced set of measured signals associated with different values of only one process parameter. In addition, a reduced order measurement model is trained to establish a functional relationship between the reduced set of measured signals sensitive to only one process parameter and the value of that process parameter.

In another further aspect, a trained profile model is employed to estimate shape profiles from process parameter values directly without the use of a process simulator. The profile model is trained to establish a mapping between a set of values for each process parameter under consideration that spans a Design Of Experiments (DOE) parameter space and the resulting shape profiles.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for estimating values of process parameters based on measurements of structures fabricated on a product wafer are presented herein. Exemplary process parameters include lithography dosage and exposure and lithography scanner aberrations. The measurements are in-line measurements performed quickly and with sufficient accuracy to enable yield improvement of an on-going semiconductor fabrication process flow.

In one aspect, a measurement model including geometric parameters of structures under measurement and process parameters is employed to estimate process parameter values from measurements of structures on a wafer.

Figure 1:
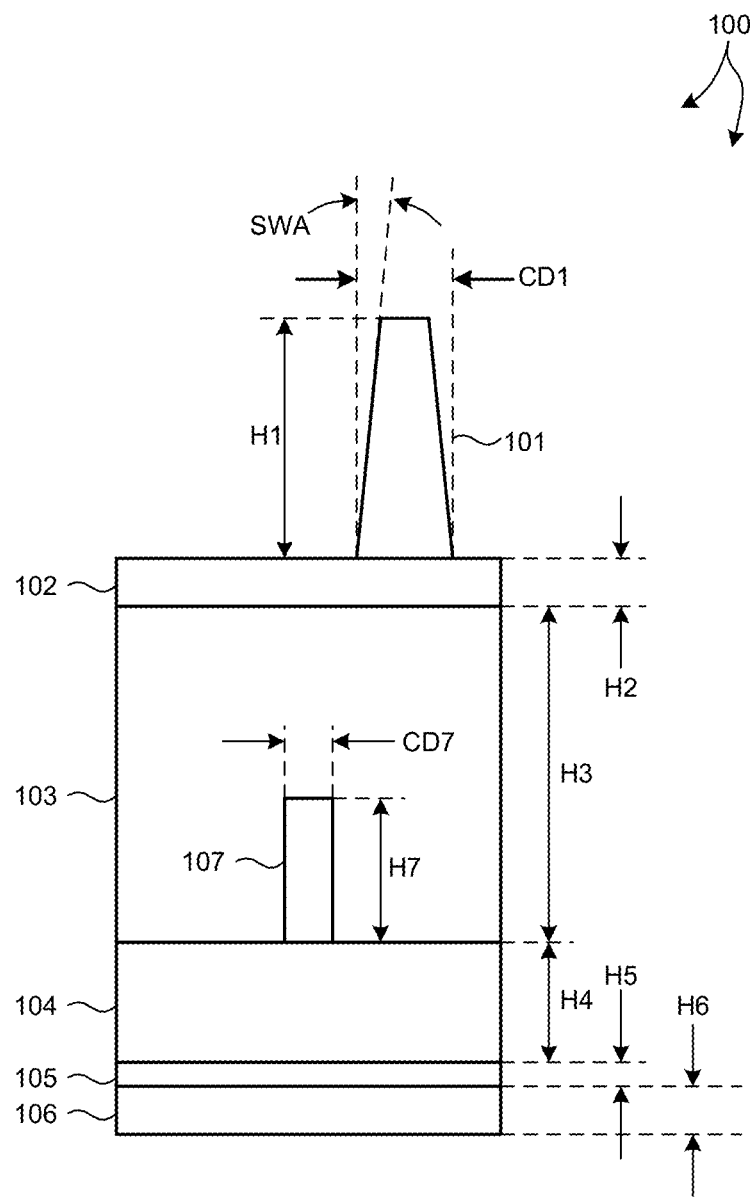
FIG. 1 depicts an exemplary structure 100 under measurement in accordance with the methods and systems described herein.

FIG. 1 depicts an exemplary structure 100 under measurement in accordance with the methods and systems described herein. Structure 100 includes a photoresist structure 101, layers 102-106, and a structure 107 buried in layer 103. At the process state depicted in FIG. 1, process parameters such as lithography focus and dosage control the dimensions of photoresist structure 101.

Figure 2:
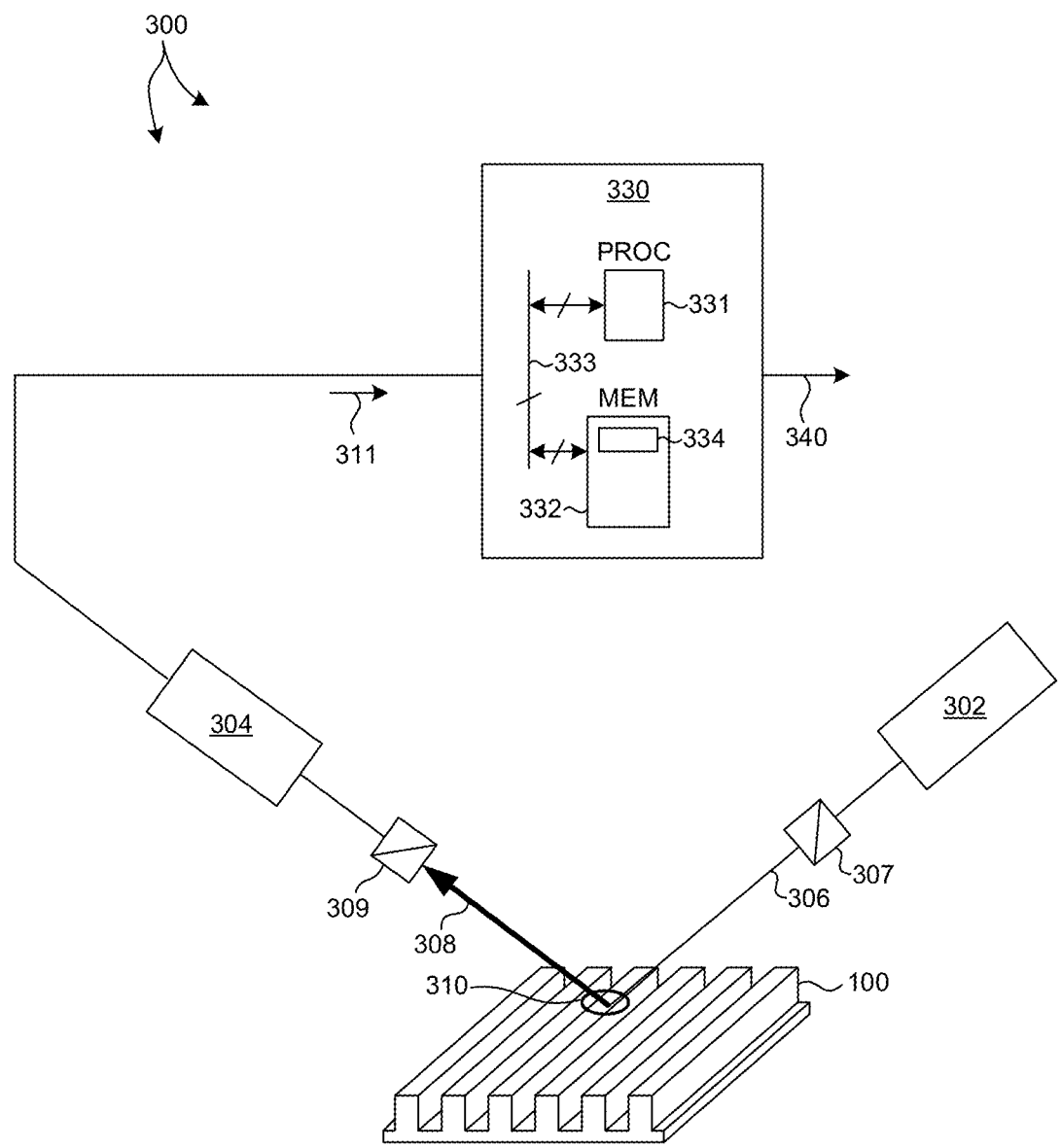
FIG. 2 illustrates a system 300 for measuring characteristics of a specimen in accordance with the exemplary methods presented herein.

FIG. 2 illustrates a system 300 for measuring characteristics of a specimen in accordance with the exemplary methods presented herein. As shown in FIG. 2, the system 300 may be used to perform spectroscopic ellipsometry measurements of structure 100 depicted in FIG. 1. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 100-2500 nm) to the structure disposed on the surface of the specimen upon which structure 100 is fabricated. In turn, the spectrometer 304 is configured to receive illumination reflected from structure 100. It is further noted that the light emerging from the illuminator 302 is polarized using a polarization state generator 307 to produce a polarized illumination beam 306. The radiation reflected by structure 100 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure as described herein.

As depicted in FIG. 2, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof.

In a further embodiment, system 300 may include one or more computing systems 330 employed to perform measurements of structures based on measurement models developed in accordance with the methods described herein. The one or more computing systems 330 may be communicatively coupled to the spectrometer 304. In one aspect, the one or more computing systems 330 are configured to receive measurement data 311 associated with measurements of a structure under measurement (e.g., structure 100).

Figure 3:
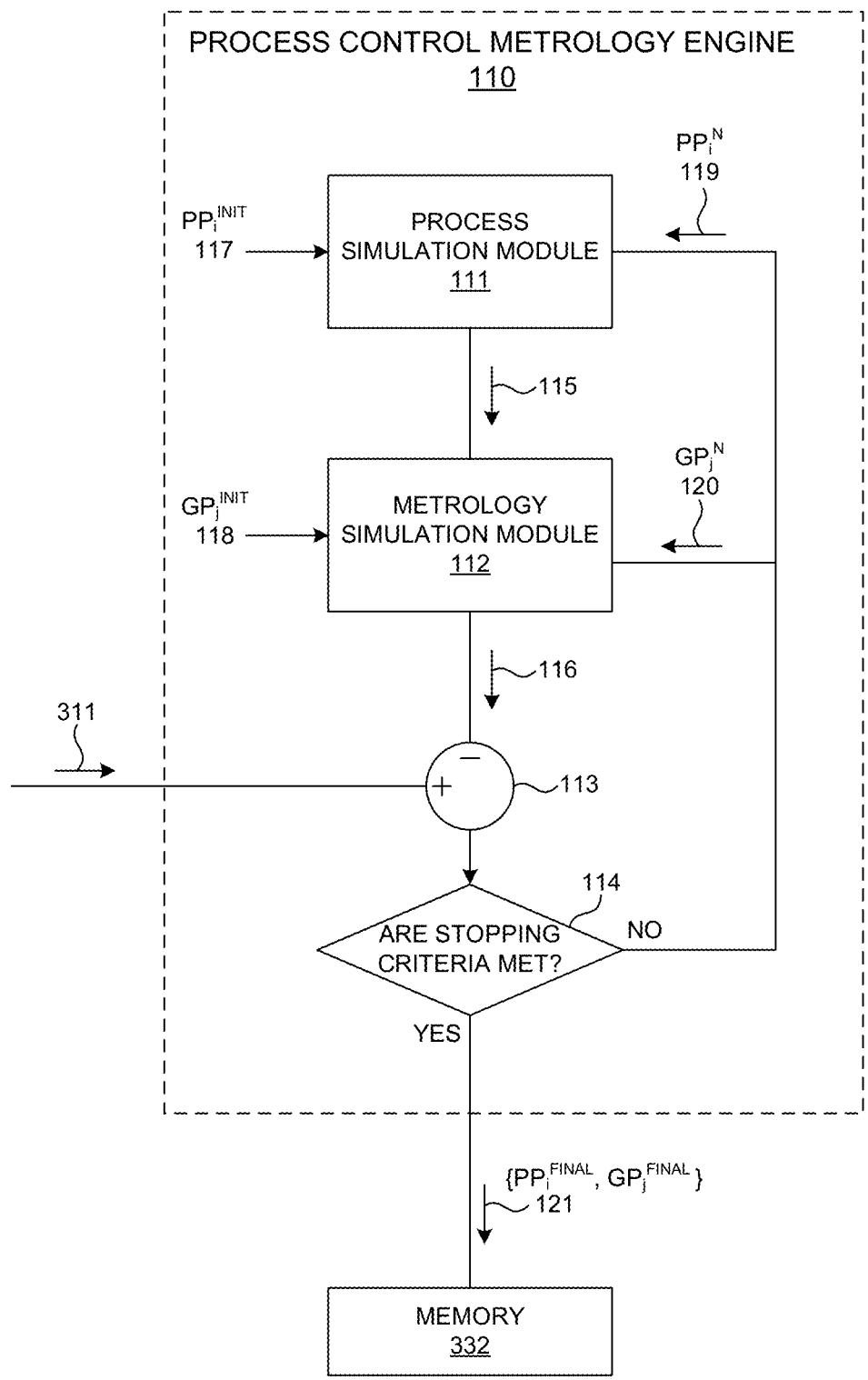
FIG. 3 is a diagram illustrative of an exemplary process control metrology engine 110 in one embodiment.

In one aspect, computing system 330 is configured as a process control metrology engine to estimate process parameter values based on measurements of structures under measurement. FIG. 3 is a diagram illustrative of an exemplary process control metrology engine 110 in one embodiment. As depicted in FIG. 3, process control metrology engine 110 includes a process simulation module 111 and a metrology simulation module 112.

Process control metrology engine 110 employs a model based regression of both a process model and a metrology model to arrive at estimates of at least one process parameter value based on measurements of a fabricated structure. The process and metrology models describe the sensitivity of both process parameters and geometric parameters of underlayers, films, buried structures, etc., on metrology signals generated by a particular metrology system. A regression based optimization tunes all process parameters and geometric parameters concurrently to estimate shape profiles of the structure under consideration such that simulated measurement signals from a particular metrology system best match actual measured signals from the same metrology system. In some examples, the regression based optimization algorithm employed to tune process and geometric parameters concurrently is any of a Levenberg-Marquardt algorithm, a Newton method, a primal-dual interior point method, a Nelder-Mead method, or any other suitable algorithm.

In one example, process simulation module 111 includes a process model that provides an estimate of the shape of photoresist structure 101, depicted in FIG. 1, based on process parameter values, such as lithography focus, dosage, and aberrations. In this example, the process model is a model of the shape of the geometry of photoresist structure 101, and the shape is parameterized by a height parameter, H1, a critical dimension parameter, CD1, and a sidewall angle parameter, SWA. In another example process simulation module 111 includes a process model that provides an estimate of the shape of a structure based on etch parameters such as etch time.

Metrology simulation module 112 includes a metrology model that describes the expected measurement signals (e.g., signals 311 depicted in FIG. 2) for a measurement of a particular structure (e.g., structure 100) by a particular metrology system (e.g., metrology system 300) based on a set of parameter values describing the geometry of the structure under measurement. In addition, the metrology model includes one or more system parameters such as angle of incidence, azimuth angle, stage positioning error, optics aberrations, focusing errors, etc.

In one example, the metrology model includes a geometric model that describes the dimensions of the layer structures 102-106 and buried structure 107. In one example, each layer is parameterized by a height parameter. Similarly, buried structure 107 is parameterized by a height parameter, H7, and a critical dimension parameter, CD7. In this example, the dimensions of photoresist structure 101 (i.e., H1, CD1, and SWA) are defined by the process model. Similarly, the dimensions of the layer structures 102-106 and buried structure 107 (i.e., H2-H7 and CD7) are defined by the geometric model. In this sense, the simulated shape of photoresist structure 101 is determined by the parameters of the process model (i.e., H1, CD1, and SWA), and the simulated shapes of the layer structures 102-106 and buried structure 107 are determined by the parameters of the geometric model (i.e., H2-H7 and CD7).

As depicted in FIG. 3, process simulation module 111 receives an initial value for each process parameter of a set of process parameters under measurement, $PP_i^{init}$ 117. The set of process parameters under measurement may include any number of different process parameters (e.g., lithography focus, dosage, etc.). Process simulation module 111 estimates geometric parameter values of the structures described by the process model. In one example, process simulation module 111 estimates values of H1, CD1, and SWA of photoresist structure 101 for given values of lithography focus and dosage.

Metrology simulation module 112 receives the geometric parameter values estimated by process simulation module 111 and an initial value for each geometric parameter of a set of geometric parameters describing the structure under measurement (e.g., structure 100). In this sense, metrology simulation module 112 incorporates the geometric parameter values 115 estimated by process simulation module 111 and additional geometric parameter values, $GP_j^{INIT}$ 118, to fully describe the structure under consideration. Based on these values metrology simulation module 112 estimates a set of measurement signals 116 that would be generated by a particular metrology system if that particular metrology system were employed to measure the modeled structure parameterized by the values of the geometric parameters under consideration.

A difference module 113 receives simulated measurement signals 116 and actual measurement signals corresponding to an actual measurement of a structure fabricated by the same processing system modeled by process simulation module 111 and measured by the same metrology system simulated by metrology simulation module 112. Although the measured structure is parameterized by the same set of parameters, the actual value of the parameters is unknown, including one or more process parameter values (e.g., lithography focus and dosage). Difference module 113 determines a difference between the measured signals (e.g., signals 311) and simulated signals 116. The difference can be expressed in many forms (e.g., actual difference values, variance, root mean squared difference values, Chi-squared values, etc.). The difference values are compared to one or more stopping criteria in block 114. Stopping criteria 114 may include any combination of error values, convergence criteria, maximum number of iterations, etc. If the difference is smaller than an acceptable difference required by the stopping criteria, the process parameter values, $PP_i$, and the geometric parameter values, $GP_j$, employed by process simulation module 111 and metrology simulation module 112 are considered to a valid estimate of the parameter values associated with the actual structure measured by the metrology system (e.g., structure 100). These values, $P_i^{FINAL}$ and $GP_j^{FINAL}$ 121 are stored in a memory (e.g., memory 332). However, if the difference is larger than an acceptable difference required by the stopping criteria, new process parameter values, $PP_i^N$ 119, and the geometric parameter values, $GP_j^N$ 120 are generated and communicated to process simulation module 111 and metrology simulation module 112, respectively. In some embodiments, the new values are generated by a gradient descent method. However, in general, any suitable linear or non-linear parameter search algorithm may be employed to determine the new values. These new values are employed in iteration to arrive at new values of $PP_i$ and $GP_j$, resulting in a smaller difference between actual 311 and simulated 116 measurement signals. The iteration continues in this manner until the stopping criteria are met, and values $PP_i^{FINAL}$ and $GP_j^{FINAL}$ 121 are stored in a memory (e.g., memory 332).

Figure 4:
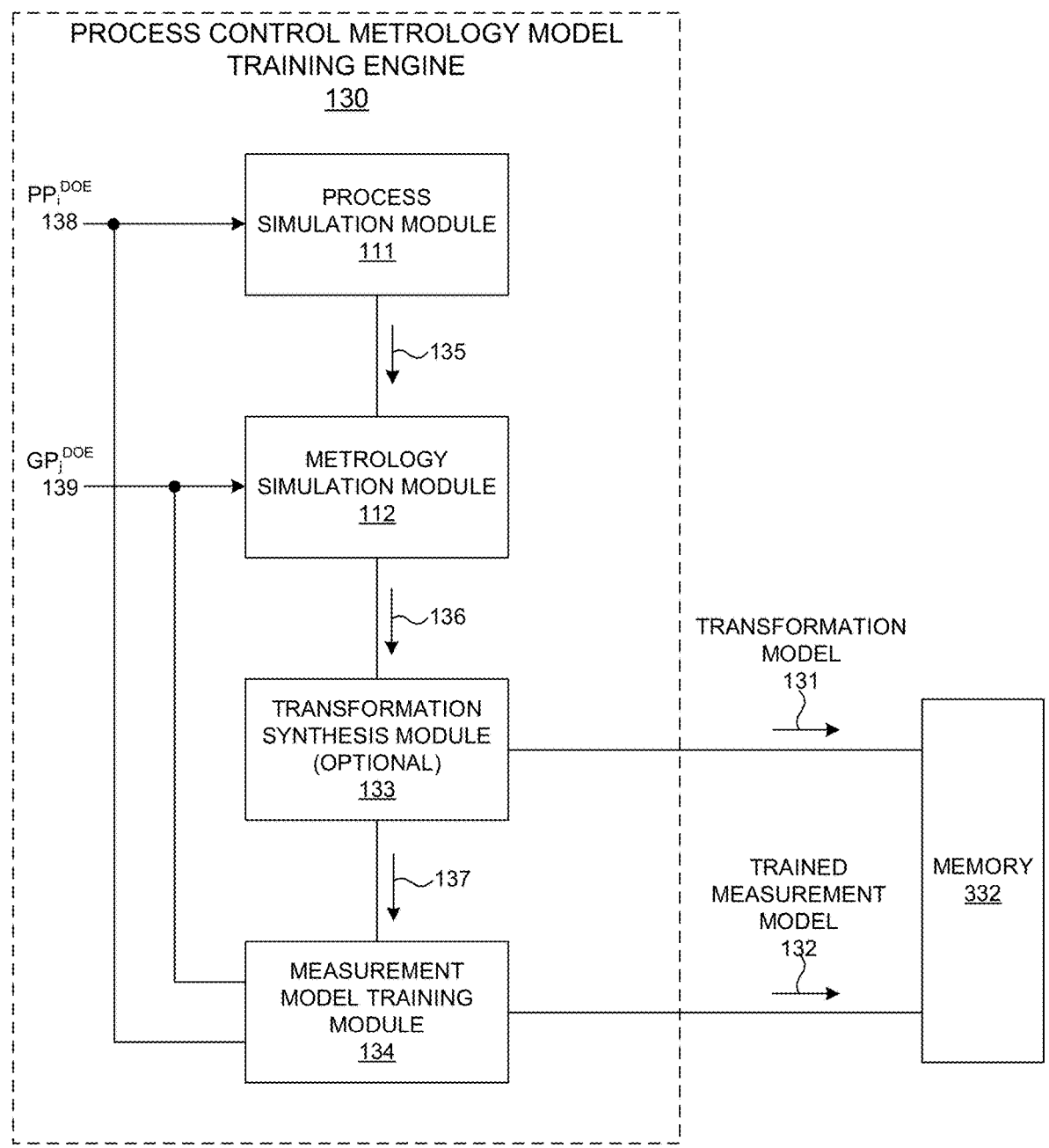
FIG. 4 is a diagram illustrative of an exemplary process control metrology model training engine 130 in one embodiment.

In another aspect, computing system 330 is configured as a process control metrology model training engine to train a measurement model employed to directly estimate process parameter values based on measurements of structures under measurement. FIG. 4 is a diagram illustrative of an exemplary process control metrology model training engine 130 in one embodiment. As depicted in FIG. 4, process control metrology model training engine 130 includes process simulation module 111 and metrology simulation module 112, as described with reference to FIG. 3. In addition, engine 130 includes a transformation synthesis module 133 and a measurement model training module 134.

As described with reference to FIG. 3, process simulation module 111 is employed to estimate shape profiles 135 of a structure under consideration that result from a simulated fabrication process executed with different sets of process parameter values. The process parameter values, $PP_i^{DOE}$ 138, employed by process control metrology model training engine 130 include a set of values for each process parameter under consideration that spans a Design Of Experiments (DOE) parameter space. In general, the DOE parameter space spans the range of possible process parameter values likely to be encountered in an actual fabrication scenario. Each set of shape profiles 135 represents a different shape profile of a fabricated structure (e.g., structure 101) corresponding to a different set of process parameter values within the DOE process window. Process simulation module 111 simulates the series of process steps defined by the underlying process model.

Figure 9:
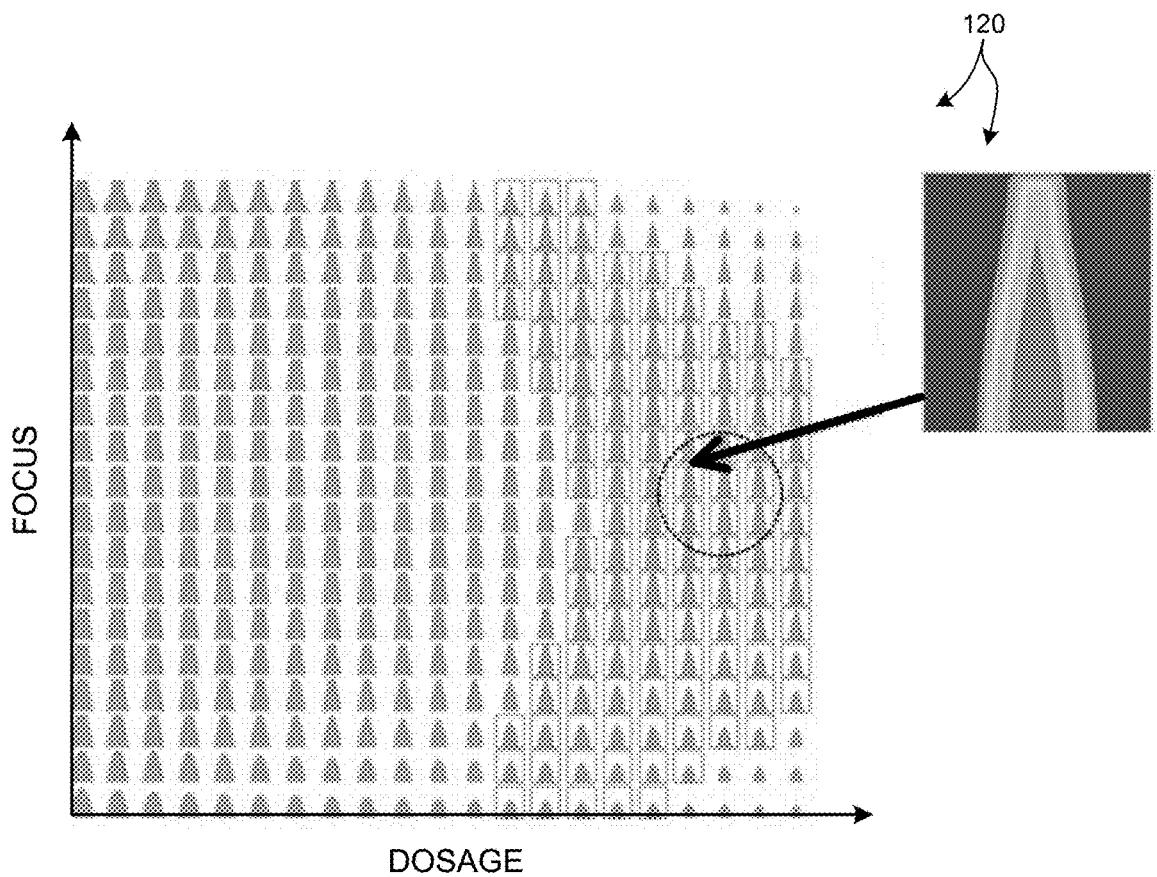
FIG. 9 depicts an illustration 120 of an array of different shape profiles associated with structure 101 for different values of lithography focus and dosage.

FIG. 9 depicts an illustration 120 of an array of different shape profiles associated with structure 101 for different values of lithography focus and dosage. Changes in focus are reflected in changes in shape along the horizontal axis and changes in dosage are reflected in changes in shape along the vertical axis. In one example shape profiles 135 include a set of three parameters (H1, CD1, and SWA) associated with each shape profile of the array depicted in FIG. 9.

Metrology simulation module 112 receives the sets of geometric parameter values 135 estimated by process simulation module 111 and additional sets of geometric parameter values, $GP_j^{DOE}$ 139. $GP_j^{DOE}$ 139 includes sets of parameter values for each geometric parameter describing the structure under consideration (e.g., structure 100) that spans the Design Of Experiments (DOE) parameter space. In this sense, metrology simulation module 112 includes a geometric model that describes the structure under consideration for each set of geometric parameter values 135 estimated by process simulation module 111 and each set of geometric parameter values, $GP_j^{DOE}$ 139, describing other features of the structure under consideration. Based on these values, metrology simulation module 112 estimates a set of measurement signals 136 that would be generated by a particular metrology system if that particular metrology system were employed to measure the modeled structure parameterized by the values of the geometric parameters under consideration. Each set of simulated measurement values corresponds to a different set of point in the DOE parameter space.

Transformation synthesis module 133 determines a transformation model 131 that reduces a dimension of the simulated measurement signal data 136. The transformation model 131 maps signals 136 to a new reduced set of signals. The transformation is determined based on the variations in the parameter(s) of interest in the set of signals 136. Each signal is treated as an original signal that changes within the process range. The transformation model 131 may be applied to all signals 136, or a subset of signals 136. In some examples, the signals subject to analysis by the transformation model are chosen randomly. In some other examples, the signals subject to analysis by the transformation model are chosen due to their relatively high sensitivity to changes in the process parameter(s) of interest. For example, signals that are not sensitive to changes in the process parameter(s) of interest may be ignored. In some examples, a transformation model is not employed at all. In this sense, transformation synthesis module 133 is optional.

In general, any of the transformation models described herein may be linear or non-linear. By way of non-limiting example, a transformation model may a principal component analysis (PCA) model, a kernel PCA model, a non-linear PCA model, an independent component analysis (ICA) model, a trained auto-encoder, or other dimensionality reduction methods using dictionaries, a discrete cosine transform (DCT) model, fast fourier transform (FFT) model, a wavelet model, etc. In addition, any of the transformation models described herein may include interpolation, noise reduction, etc. As described herein, the use of transformation models described herein is optional.

As depicted in FIG. 4, transformation synthesis module 133 determines a transformation model 131 and applies the transformation model to signals 136 to generate a reduced set of signals 137.

In one aspect, the DOE training data provided to a measurement model training module includes process parameter values, in addition to geometric parameter values associated with the structures of interest.

Figure 5:
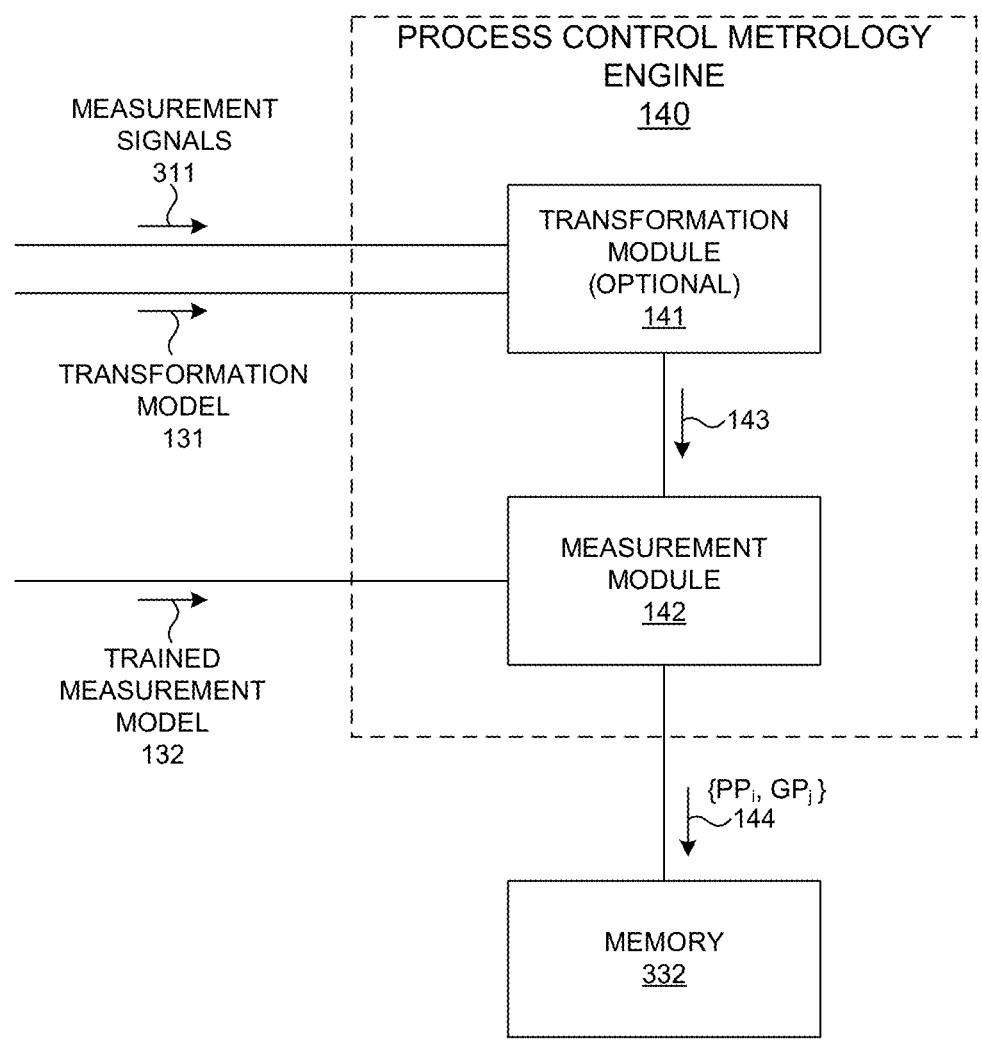
FIG. 5 is a diagram illustrative of an exemplary process control metrology engine 140 in one embodiment.

As depicted in FIG. 5, the reduced set of signals is received by measurement model training module 134. Measurement model training module 134 trains a measurement model 132 that establishes a functional relationship between measurements of actual structures and values of parameters of interest, including one or more process parameter values. The measurements are performed by the same metrology system simulated by metrology simulation module 112. Measurement model training module 134 receives the set of process parameter values, geometric parameter values, and corresponding reduced measurement signals 137 associated with each point in the process parameter DOE space. The received data is used to train the measurement model that predicts process parameter values from actual, reduced measurement signals.

In general, any of the trained models described herein is a signal response metrology (SRM) model. In some examples, measurement model 132, is a signal response metrology (SRM) model that defines a direct, functional relationship between actual measurements and parameters of interest.

In general, any of the trained models described herein is implemented as a neural network model. In other examples, any of the trained models may be implemented as a linear model, a non-linear model, a polynomial model, a response surface model, a support vector machines model, a random forest model, a deep network model, a convolutional network model, or other types of models.

In some examples, any of the trained models described herein may be implemented as a combination of models.

Transformation model 131 and trained measurement model 132 are communicated from process control metrology model training engine 130 to a memory (e.g., memory 332), where they are stored.

In a further aspect, computing system 330 is configured as a process control metrology engine to directly estimate process parameter values based on measurements of structures using a trained measurement model. FIG. 5 is a diagram illustrative of an exemplary process control metrology engine 140 in one embodiment. As depicted in FIG. 5, process control metrology engine 140 includes a transformation module 141 and measurement module 142.

As depicted in FIG. 5, transformation module 141 employs transformation model 131, described with reference to FIG. 4, to transform actual measurement signals (e.g., signals 311) to a reduced set of measurement signals 143. Transformation model 131 was generated based on DOE measurements of a particular structure (e.g., structure 100) by a particular metrology system (e.g., metrology system 300). As depicted in FIG. 5, transformation model 131 is applied to actual measurements of the same nominal structure (e.g., structure 100) by the same nominal metrology system (e.g., metrology system 300). The reduced set of measurement signals 143 are communicated to measurement module 142. Measurement module 142 employs trained measurement model 132, described with reference to FIG. 4, to directly estimate values of parameters of interest (e.g., $\{PP_i, GP_j\}$ 144), including at least one process parameter value. The estimated values are communicated to a memory (e.g., memory 332), and stored.

Figure 6:
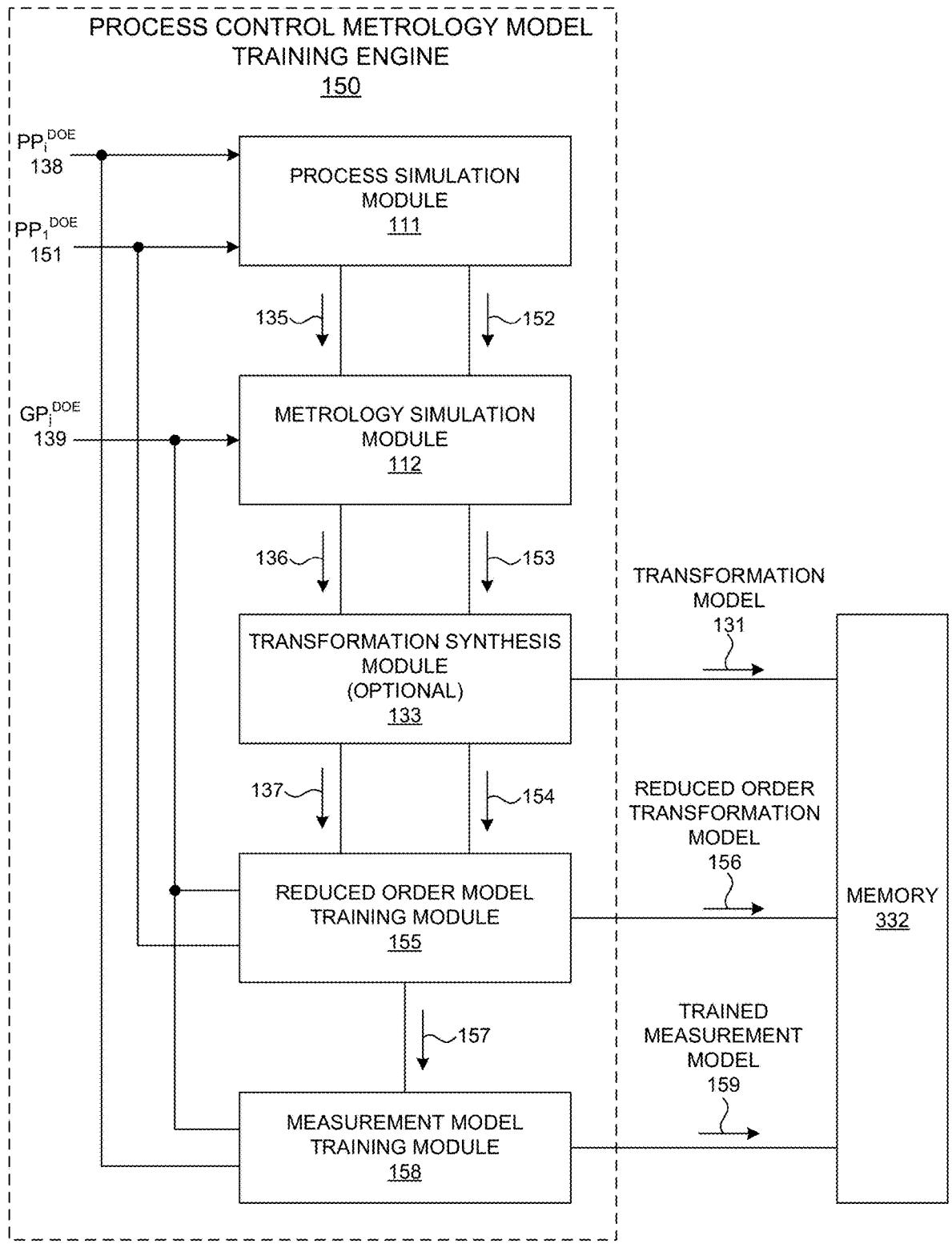
FIG. 6 is a diagram illustrative of an exemplary process control metrology model training engine 150 in another embodiment.

FIG. 6 is a diagram illustrative of an exemplary process control metrology model training engine 150 in another embodiment. As depicted in FIG. 6, process control metrology model training engine 150 includes like numbered elements as described with reference to FIG. 4. Process control metrology model training engine 150 trains a simplified measurement model that is suitable for estimating the value of one process parameter. The simplified measurement model reduces the computation complexity associated with model training and use.

As depicted in FIG. 6, process simulation module 111 is employed to generate shape profiles 135 associated with different values of each of the full set of process parameters over the full DOE space (i.e., $PP_i^{DOE}$ 138). In addition, process simulation module 111 is employed to generate shape profiles 152 associated with different values of one process parameter over the full DOE space (i.e., $PP_i^{DOE}$ 151), while values of other process parameters are held fixed.

Similarly, metrology simulation module 112 is employed to generate measurement signals 136 associated with the full set of process parameters (i.e., $PP_i^{DOE}$ 138) and geometric parameters (i.e., $GP_i^{DOE}$ 139). In addition, metrology simulation module 112 is employed to generate measurement signals 153 associated with geometric parameters (i.e., $GP_i^{DOE}$ 139) and different values of one process parameter over the full DOE space (i.e., $PP_1^{DOE}$ 151), while values of other process parameters are held fixed.

As described with reference to FIG. 4, transformation synthesis module 133 determines a transformation model 131 that reduces a dimension of the simulated measurement signal data 136. The transformation model 131 is employed to generate reduced signal data 137 from signal data 136. In addition, transformation synthesis module 133 determines another transformation model that reduces a dimension of the simulated measurement signal data 153. This model is employed to generate reduced signal data 154 from signal data 153.

As depicted in FIG. 6, the reduced set of signals 137 and the reduced set of signals 154 are received by reduced order model training module 155. In addition, the geometric parameters (i.e., $GP_i^{DOE}$ 139) and different values of one process parameter over the full DOE space (i.e., $PP_1^{DOE}$ 151) are received by module 155. Reduced order model training module 155 trains a reduced order transformation model 156 that establishes a functional relationship between reduced measured signals 137 associated with the full range of process parameters and reduced measured signals 154 associated with different values of only one process parameter.

The trained, reduced order transformation model 156 is employed to predict a reduced set of metrology signals 157 from metrology signals 137. Measurement model training module 158 trains a measurement model 159 that establishes a functional relationship between a reduced set of measurement signals associated with the measurement of an actual structure and values of parameters of interest, including one or more process parameter values. The measurements are performed by the same metrology system simulated by metrology simulation module 112. Measurement model training module 158 receives the set of process parameter values, geometric parameter values, and corresponding reduced measurement signals 157 associated with each point in the process parameter DOE space. The received data is used to train the measurement model that predicts process parameter values from actual, reduced measurement signals.

Transformation model 131, trained, reduced order transformation model 156, and trained measurement model 159 are communicated from process control metrology model training engine 150 to a memory (e.g., memory 332), where they are stored.

Figure 7:
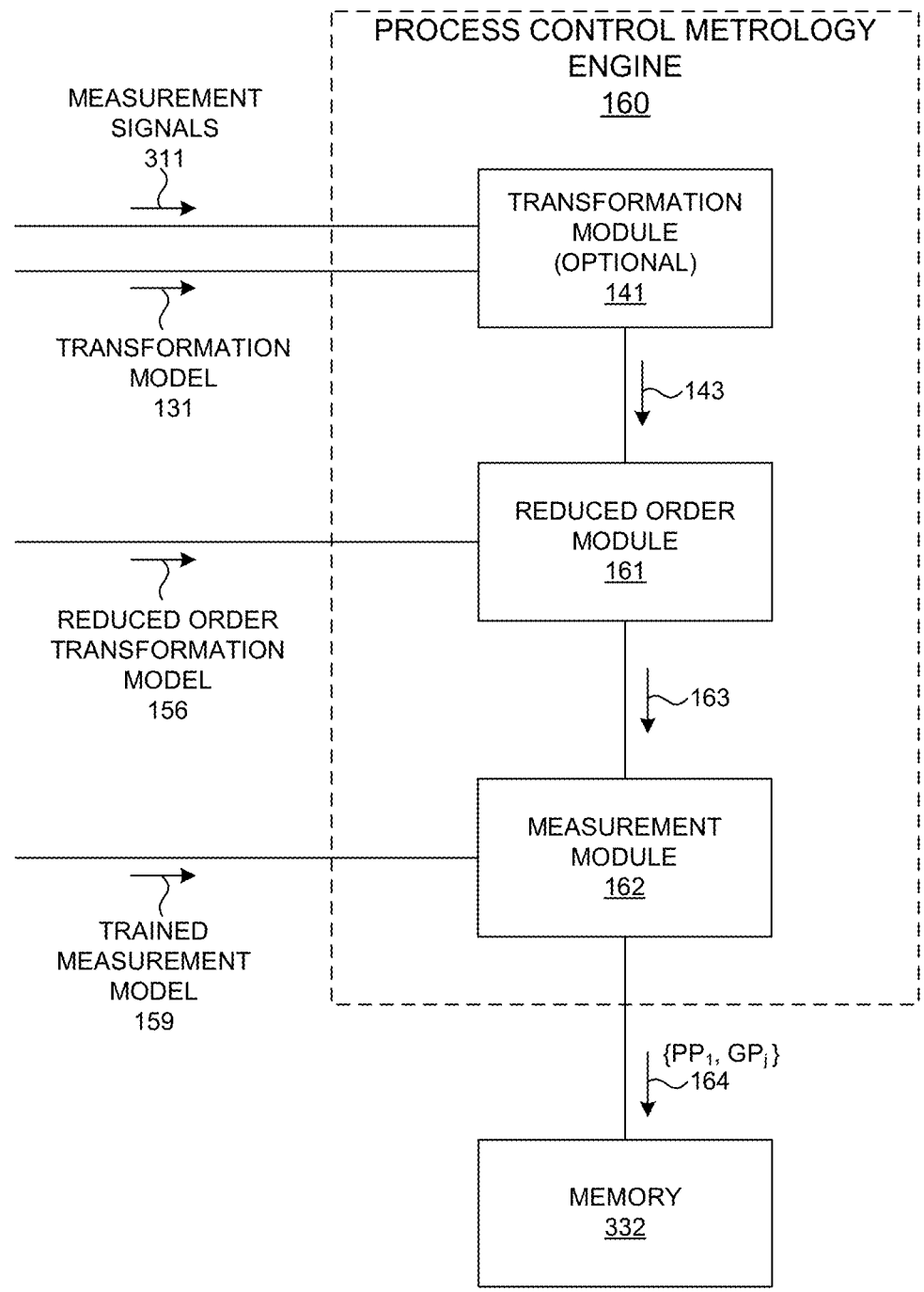
FIG. 7 is a diagram illustrative of an exemplary process control metrology engine 160 in another embodiment.

FIG. 7 is a diagram illustrative of an exemplary process control metrology engine 160 in another embodiment. As depicted in FIG. 7, process control metrology engine 160 includes a transformation module 141, reduced order module 161, and measurement module 162.

As depicted in FIG. 7, transformation module 141 employs transformation model 131, described with reference to FIG. 4, to transform actual measurement signals (e.g., signals 311) to a reduced set of measurement signals 143. Transformation model 131 was generated based on DOE measurements of a particular structure (e.g., structure 100) by a particular metrology system (e.g., metrology system 300). As depicted in FIG. 7, transformation model 131 is applied to actual measurements of the same nominal structure (e.g., structure 100) by the same nominal metrology system (e.g., metrology system 300). The reduced set of measurement signals 143 are communicated to reduced order module 161. Reduced order module 161 employs reduced order transformation model 156 to determine a set of reduced order signals 163 from the reduced set of measurement signals 143. The reduced set of measurement signals 163 is sensitive to changes in a single process parameter, $PP_1$, rather than many process parameters. As a result the dimension of signals 163 is significantly reduced compared to signals 143. Measurement module 162 employs trained measurement model 159, described with reference to FIG. 6, to directly estimate a value of a process parameter of interest and additional geometric parameters of interest (e.g., $\{PP_1, GP_j\}$ 164) based on signals 163. Trained measurement model The estimated values are communicated to a memory (e.g., memory 332), and stored.

In the embodiments described with reference to FIGS. 6 and 7, a trained measurement model is employed to establish a direct, functional relationship between reduced order signals and a process parameter value. However, in some other embodiments, a process parameter is determined from a set of reduced order measurement signals based on a regression analysis analogous to that described with reference to FIG. 3. In these embodiments, a particular process parameter is floated, while all other parameters are fixed to nominal values. The process parameter values are selected to minimize the differences between simulated spectra to actual measured spectra.

In a further aspect, a profile model is trained to establish a direct, functional relationship between process parameter values and geometric parameter values associated with a structure fabricated in accordance with a particular process.

As described herein, a process simulation module 111 is employed to simulate the expected shape profile associated with a fabrication process executed with a particular set of process parameter values. Employing a process simulator directly provides accurate results, but is computationally burdensome. In some embodiments, a profile model is employed to estimate shape profiles from process parameter values directly without the use of a process simulator.

Figure 8:
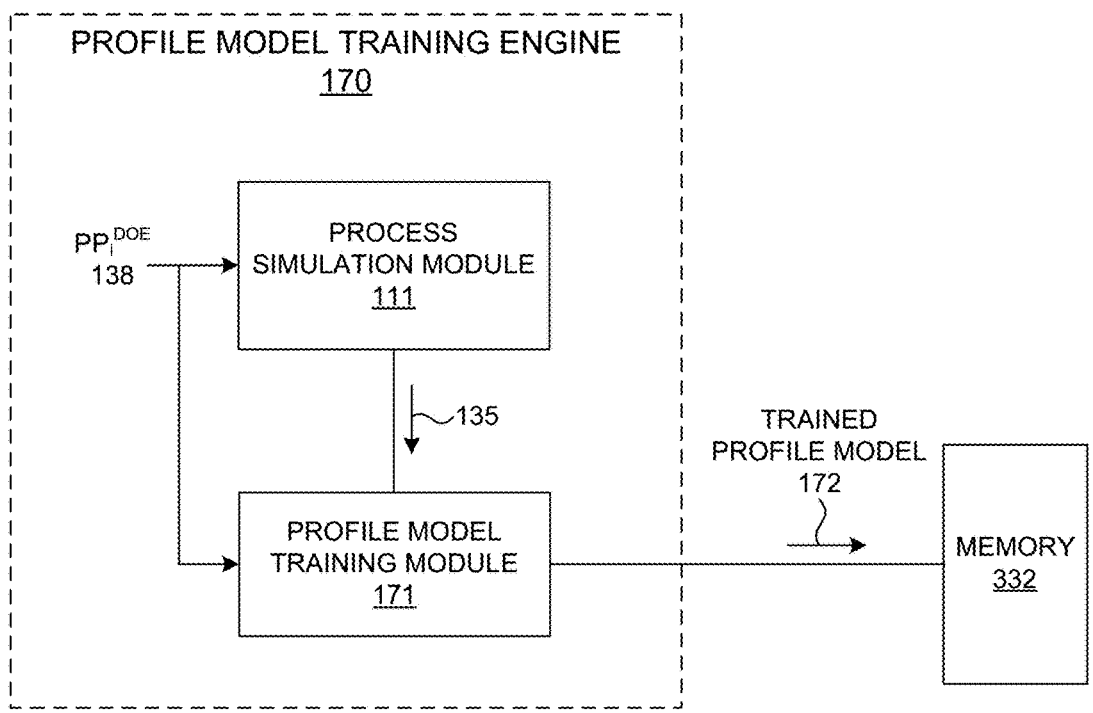
FIG. 8 depicts a process model training engine 170 in one embodiment.

FIG. 8 depicts a process model training engine 170 including process simulation module 111 and profile model training module 171. As described hereinbefore, process simulation module 111 estimates geometric parameter values 135 associated with a structure under consideration that result from a simulated fabrication process executed with different sets of process parameter values. The process parameter values, $PP_i^{DOE}$ 138, employed by profile model training engine 170 include a set of values for each process parameter under consideration that spans a Design Of Experiments (DOE) parameter space.

Profile model training module 171 receives geometric parameter values 135 and associated process parameter values, $PP_i^{DOE}$ 138. Profile model training module 171 establishes a functional relationship between a set of process parameter values and an expected shape profile within the process DOE space based on training data 138 and 135. The trained profile model 172 is communicated to a memory (e.g., memory 332), and stored.

Figure 10:
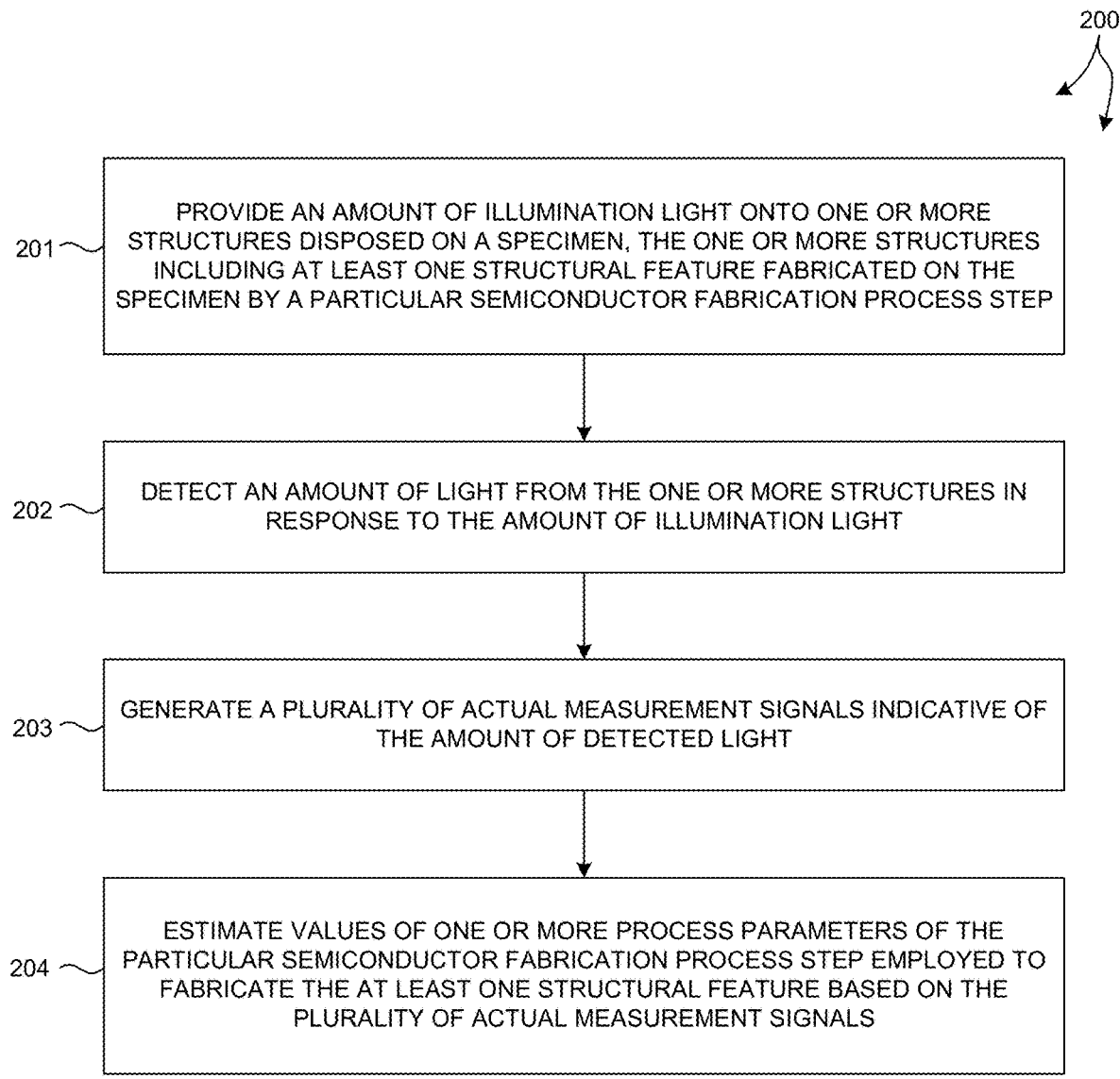
FIG. 10 illustrates a flowchart of a method 200 for estimating values of process parameters of interest from measurements of structures fabricated on a wafer.

FIG. 10 illustrates a method 200 for estimating values of process parameters of interest from measurements of structures fabricated on a wafer. Method 200 is suitable for implementation by a metrology system such as metrology system 300 illustrated in FIG. 2 of the present invention. In one aspect, it is recognized that data processing blocks of method 200 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 201, an amount of illumination light is provided onto one or more structures disposed on a specimen. The one or more structures include at least one structural feature fabricated on the specimen by a particular semiconductor fabrication process step.

In block 202, an amount of light is detected from the one or more structures in response to the amount of illumination light.

In block 203, a plurality of actual measurement signals indicative of the amount of detected light are generated, for example, by spectrometer 304.

In block 204, values of one or more process parameters of the particular semiconductor fabrication process step employed to fabricate the at least one structural feature are estimated based on the plurality of actual measurement signals.

Methods and systems for estimating parameter values associated with a particular process from measurements of structures fabricated by the process are described herein. However, in addition, the methods and systems described herein are suitable for estimating geometric parameter values. By way of non-limiting example, the estimation of geometric parameter values associated with critical dimension (CD), overlay, height, sidewall angle, edge placement error (EPE), pitch walk, etc., is contemplated within the scope of this patent document.

In general, the measurements may be performed either on device structures or on device-like structures located, e.g. in the scribeline area, to make them more suitable for metrology measurement. In some examples, the measured structures are periodic, such as a periodic grating structure. By way of non-limiting example, the measured structure may be a line-space grating, FinFet structure, SRAM device structure, Flash memory structure, DRAM memory structure, etc.

In some examples, the structure under measurement is a metrology target. The targets are designed for printability and sensitivity to changes in process parameters, structural parameters of interest, or both. In some embodiments, the targets are based on conventional line/space targets. By way of non-limiting example, CD targets, SCOL targets, or AiM™ targets available from KLA-Tencor Corporation, Milpitas, Calif. (USA) may be employed.

Regardless of the type of target employed, a set of targets that exhibit sensitivity to the process variations, structural variations, or both, being explored must be provided to train a measurement model. Once the model is trained, it may be used to perform measurements of the same structure, or different structures having similar sensitivity. Similarly, a set of targets that exhibit sensitivity to the process variations, structural variations, or both, being explored must be provided to drive a regression analysis as described herein.

In another further aspect, the metrology targets located on the wafer are preferably design rule targets. In other words, the metrology targets adhere to the design rules applicable to the underlying semiconductor manufacturing process. In some examples, the metrology targets are preferably located within the active die area. In some examples, the metrology targets have dimensions of 15 µm by 15 µm, or smaller. In this manner, the impact on overlay of intra-field variations induced by lithographic imperfections can be analyzed. In some other examples, the metrology targets are located in the scribe lines, or otherwise outside the active die area.

In a further aspect, a separate measurement model is trained for each parameter of interest. In this manner, each measurement model is optimized individually for better performance with respect to each particular parameter of interest. In some examples, a trained measurement model is employed to measure a process parameter of interest (e.g., focus/dose, exposure, etc.), and another trained measurement model is employed to measure a structural parameter of interest (e.g., EPE, overlay, CD, pitch walk, etc.). In some embodiments, the same measurement data is used to create different measurement models for different parameters of interest.

In some examples, measurement data may be simulated using an electromagnetic simulation engine such as rigorous coupled wave analysis (RCWA). In some other examples, shape data may be simulated using a process simulator such as PROLITH®, available from KLA-Tencor Corporation, Milpitas, Calif. (USA).

In general, the aforementioned measurement techniques may be applied to the measurement of process parameters, structural parameters, layout parameters, dispersion parameters, or any combination thereof. By way of non-limiting example, overlay, profile geometry parameters (e.g., critical dimension, height, sidewall angle), process parameters (e.g., focus, and dose), dispersion parameters, layout parameters (e.g., pitch walk, edge placement errors), or any combination of parameters may be measured using the aforementioned techniques. A set of metrology targets with variations of each parameter of interest must be provided.

The trained measurement models described herein receive raw measurement data directly as input and provide values of parameters of interest as output. By streamlining the measurement process, the predictive results are improved along with a reduction in computation and user time. In some examples, a trained measurement model can be created in less than an hour. In addition, by employing a simplified model, measurement time is reduced compared to existing metrology methods.

In another further aspect, the methods and systems for training the SRM model include an optimization algorithm to automate any or all of the elements required to arrive at a trained measurement model.

In some examples, an optimization algorithm is configured to maximize the performance of the measurement (defined by a cost function) by optimizing any or all of the following parameters: the type of measurement model and the parameters of the selected measurement model. The optimization algorithm can include user defined heuristics and can be combination of nested optimizations (e.g., combinatorial and continuous optimization).

In a further aspect, measurement data from multiple, different targets is collected for model building, training, and measurement. The use of data associated with multiple targets having different structure, but formed by the same process conditions increases the information embedded in the model and reduces the correlation to process or other parameter variations. The additional information embedded in the model allows for a decoupling of information content associated with one parameter of interest from information associated with other parameters (e.g., film thicknesses, CD, etc.) that may affect the measured signals in a similar manner. In these examples, the use of training data that includes measurements of multiple, different targets at one or more measurement sites enables more accurate parameter estimation. In some examples, a mixture of isolated and dense line/space targets is employed to decouple overlay from underlayer effects. In some examples, multiple, different targets offset in orthogonal directions are employed in each die. This may be advantageous to minimize the effects of underlayers on measurement accuracy. In one example, SRAM device area can be used as one metrology target because it is sensitive to CD changes in combination with another metrology target sensitive to overlay.

In general, measurement data collection and analysis may be performed across the entire wafer or a subset of the wafer area.

In general, any measurement technique, or combination of two or more measurement techniques may be contemplated within the scope of this patent document as the data processed by a process control metrology engine measurement model measurement or the data processed by a process control metrology model training engine is in vector form. Because the signal response metrology techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the signal response metrology techniques described herein include, but are not limited to spectroscopic ellipsometry, including Mueller matrix ellipsometry, spectroscopic reflectometry, including single wavelength, multiple wavelength, and angle resolved, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WARS), x-ray reflectivity (XRR), x-ray diffraction (XRD), grazing incidence x-ray diffraction (GIXRD), high resolution x-ray diffraction (HRXRD), x-ray photoelectron spectroscopy (XPS), raman spectroscopy, x-ray fluorescence (XRF), grazing incidence x-ray fluorescence (GIXRF), x-ray tomography, and x-ray ellipsometry. In general, any metrology technique applicable to the characterization of semiconductor structures, including image based metrology techniques, speckle based scatterometers, scanning electron microscopy (SEM), tunneling electron microscopy (TEM), and atomic force microscopy (AFM), may be contemplated, individually, or in any combination.

In general, signals from multiple targets each measured by multiple metrology techniques increases the information content in the combined set of signals and reduces the correlation to process or other parameter variations.

In a further aspect, the methods and systems for training and measuring actual device structures as described hereinbefore are implemented in a differential mode. In such a scheme the metrology target measurements and any associated reference measurements are performed at two distinct steps in the processing flow. The differences in the measured signals at each distinct processing step are treated as training signals for training purposes and measurement signals for measurement purposes.

In one example, the same location points are used for metrology target measurements at a lithography step and a subsequent etch step. The difference signal between the lithography and etch steps allows for monitoring of process variability on a per point site basis even if the structure varies between points on the wafer (e.g., due to process steps or small positioning errors). Such differential metrology mode may be preferred for metrology of SRAM device area where variations of the measurement target are present between different fields on the wafer.

In some examples, variations of the measurement target arise from a deficiency in the periodicity of the measured structures, e.g., finite structure size or in situations where the otherwise periodic structure is insufficiently repeated within the measurement spot of the metrology system. In some examples, variations of the measurement target arise from a small spot size of the optical metrology system and measurement location placement errors of the metrology system.

In some examples, the differences between actual device parameter values before and after one or more etch steps may be used as an input to the closed loop control of the etch process.

In general, differential process control metrology allows for global (wafer), field (field average), or local (per site) results that can be used, for example, to set the target bias between two process monitoring steps (i.e., etch and lithography), provide per field correction, or provide high order correction (e.g., OVL or EPE control).

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of the metrology system 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 330 and other systems (e.g., memory on-board metrology system 300, external memory, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. Moreover, the computer system 330 may send data to other systems via a transmission medium. For instance, a trained measurement model or an estimated process parameter value 340 determined by computer system 330 may be communicated and stored in an external memory. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 334 implementing methods such as those described herein may be transmitted over a transmission medium such as a wire, cable, or wireless transmission link. For example, as illustrated in FIG. 3, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

In some examples, the model building, training, and measurement methods described herein are implemented as an element of a SpectraShape® optical critical-dimension metrology system available from KLA-Tencor Corporation, Milpitas, Calif., USA. In this manner, the model is created and ready for use immediately after the required measurement data is collected by the system.

In some other examples, the model building and training methods described herein are implemented off-line, for example, by a computing system implementing AcuShape® software available from KLA-Tencor Corporation, Milpitas, Calif., USA. The resulting measurement model may be incorporated as an element of an AcuShape® library that is accessible by a metrology system performing measurements.

In yet another aspect, the process control metrology results described herein can be used to provide active feedback to a process tool (e.g., lithography tool, etch tool, deposition tool, etc.). For example, values of focus and dosage determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein may be implemented as part of the process of preparing a measurement model for off-line or on-tool measurement.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an illuminator that provides an amount of illumination light onto one or more structures disposed on a specimen, the one or more structures including at least one structural feature fabricated over one or more underlying structures, the at least one structural feature fabricated on the specimen by a particular semiconductor fabrication process step;
   a detector that detects an amount of light from the one or more structures in response to the amount of illumination light and generates a plurality of actual measurement signals indicative of the amount of detected light; and
   a process control metrology engine that estimates values of one or more fabrication process parameters of the particular semiconductor fabrication process step employed to fabricate the at least one structural feature fabricated over the one or more underlying structures based on the plurality of actual measurement signals, the process control metrology engine comprising:
   a process simulation module that determines values of one or more geometric parameters characterizing a shape of the at least one structural feature fabricated over the one or more underlying structures based on an estimated value of the one or more fabrication process parameters;
   a metrology simulation module that provides a plurality of simulated measurement signals associated with a measurement of the one or more structures by the illuminator and detector of the metrology system based on the values of the one or more geometric parameters characterizing the shape of the at least one structural feature estimated by the process simulation module and estimated values of one or more geometric parameters characterizing the one or more underlying structures; and
   a regression analysis module that optimizes the estimated value of the one or more fabrication process parameters by iteratively updating an estimated value of the one or more fabrication process parameters until a difference between the plurality of simulated measurement signals and the plurality of actual measurement signals is minimized.

2. The metrology system of claim 1, wherein the process parameter of interest is any of a lithography focus and a lithography dosage parameter.

3. The metrology system of claim 1, wherein the process control metrology engine also estimates values of one or more geometric parameters of the one or more structures based on the plurality of actual measurement signals.

4. The metrology system of claim 3, wherein the one or more geometric parameters describes at least one structural feature of the one or more structures that is not fabricated on the specimen by the particular semiconductor fabrication process step.

5. The metrology system of claim 4, wherein the one or more geometric parameters includes any of a critical dimension, height, sidewall angle, and a thickness.

6. The metrology system of claim 1, further comprising:
   a profile model training engine configured to train a profile model that provides an estimate of a shape of the at least one structural feature based on a value of the one or more process parameters.

7. The metrology system of claim 1, wherein the plurality of actual measurement signals includes signals from a combination of actual measurements of a plurality of different metrology targets formed by the same particular semiconductor fabrication process step.

8. The metrology system of claim 1, wherein the plurality of actual measurement signals includes measurements acquired by a plurality of different metrology techniques.

9. A metrology system comprising:
   an illuminator that provides an amount of illumination light onto one or more structures disposed on a specimen, the one or more structures including at least one structural feature fabricated over one or more underlying structures, the at least one structural feature fabricated on the specimen by a particular semiconductor fabrication process step;
   a detector that detects an amount of light from the one or more structures in response to the amount of illumination light and generates a plurality of actual measurement signals indicative of the amount of detected light;

a process control metrology engine that estimates values of one or more fabrication process parameters of the particular semiconductor fabrication process step employed to fabricate the at least one structural feature based on the plurality of actual measurement signals; and a process control metrology model training engine, including:

a process simulation module that provides an estimate of a shape of the at least one structural feature based on a Design Of Experiments (DOE) set of values of the one or more fabrication process parameters;

a metrology simulation module that provides a plurality of simulated measurement signals associated with a simulated measurement of the one or more structures by the illuminator and detector of the metrology system based on the estimated shape of the at least one structural feature for each of the values of the one or more fabrication process parameters of the DOE set; and a measurement model training module that trains a measurement model that functionally relates the plurality of simulated measurement signals to values of the one or more fabrication process parameters.

10. The metrology system of claim 9, the process control metrology model training engine, further comprising:

a transformation synthesis module that generates a transformation model that reduces a dimension of the plurality of simulated measurement signals for each of the values of the one or more fabrication process parameters for the training of the measurement model.

11. The metrology system of claim 10, the process control metrology engine comprising:

a transformation module that generates a plurality of reduced dimension measurement signals based on an application of the transformation model to the plurality of actual measurement signals; and a measurement module that estimates the one or more fabrication process parameter values based on an application of the trained measurement model to the plurality of reduced dimension measurement signals.

12. The metrology system of claim 11, wherein the transformation model includes a principal component analysis (PCA) model.

13. The metrology system of claim 9, wherein the measurement model is any of a linear model, a nonlinear model, a polynomial model, a neural network model, a support vector machines model, a decision tree model, and a random forest model.

14. A metrology system comprising:

an illuminator that provides an amount of illumination light onto one or more structures disposed on a specimen, the one or more structures including at least one structural feature fabricated over one or more underlying structures, the at least one structural feature fabricated on the specimen on the specimen by a particular semiconductor fabrication process step;

a detector that detects an amount of light from the one or more structures in response to the amount of illumination light and generates a plurality of actual measurement signals indicative of the amount of detected light; and a non-transitory, computer-readable medium storing an amount of computer-readable instructions processed by a computing system that causes the computing system to estimate values of one or more fabrication process parameters of the particular semiconductor fabrication process step employed to fabricate the at least one structural feature fabricated over the one or more underlying structures based on the plurality of actual measurement signals, wherein the estimating the values of the one or more fabrication process parameters involves:

estimating values of one or more geometric parameters characterizing a shape of the at least one structural feature fabricated over the one or more underlying structures based on an estimated value of the one or more fabrication process parameters;

generating a plurality of simulated measurement signals associated with a measurement of the one or more structures by the illuminator and detector of the metrology system based on the estimated values of the one or more geometric parameters characterizing the shape of the at least one structural feature and estimated values of one or more geometric parameters characterizing the one or more underlying structures; and optimizing the estimated value of the one or more fabrication process parameters by iteratively updating an estimated value of the one or more fabrication process parameters until a difference between the plurality of simulated measurement signals and the plurality of actual measurement signals is minimized.

15. The metrology system of claim 14, the non-transitory computer readable medium further storing an amount of computer-readable instructions processed by the computing system that causes the computing system to:

estimate a shape of the at least one structural feature based on a Design Of Experiments (DOE) set of values of the one or more fabrication process parameters;

determine a plurality of simulated measurement signals associated with a simulated measurement of the one or more structures by the illuminator and detector of the metrology system based on the estimated shape of the at least one structural feature for each of the values of the one or more fabrication process parameters of the DOE set; and train a measurement model that functionally relates the plurality of simulated measurement signals to values of the one or more fabrication process parameters.

16. The metrology system of claim 15, the non-transitory computer readable medium further storing an amount of computer-readable instructions processed by the computing system that causes the computing system to:

generate a plurality of reduced dimension measurement signals based on an application of a transformation model to the plurality of actual measurement signals; and estimate the one or more fabrication process parameter values based on an application of the trained measurement model to the plurality of reduced dimension measurement signals.

17. A method comprising:

providing an amount of illumination light onto one or more structures disposed on a specimen, the one or more structures including at least one structural feature fabricated over one or more underlying structures, the at least one structural feature fabricated on the specimen by a particular semiconductor fabrication process step;

detecting an amount of light from the one or more structures in response to the amount of illumination light;

generating a plurality of actual measurement signals indicative of the amount of detected light; and estimating values of one or more fabrication process parameters of the particular semiconductor fabrication process step employed to fabricate the at least one structural feature fabricated over the one or more underlying structures based on the plurality of actual measurement signals, wherein the estimating the values of the one or more fabrication process parameters involves:

estimating values of one or more geometric parameters characterizing a shape of the at least one structural feature fabricated over the one or more underlying structures based on an estimated value of the one or more fabrication process parameters;

generating a plurality of simulated measurement signals associated with a measurement of the one or more structures by the illuminator and detector of the metrology system based on the estimated values of the one or more geometric parameters characterizing the shape of the at least one structural feature and estimated values of one or more geometric parameters characterizing the one or more underlying structures; and optimizing the estimated value of the one or more fabrication process parameters by iteratively updating an estimated value of the one or more fabrication process parameters until a difference between the plurality of simulated measurement signals and the plurality of actual measurement signals is minimized.

18. The method of claim 17, further comprising:

estimating a shape of the at least one structural feature based on a Design Of Experiments (DOE) set of values of the one or more fabrication process parameters;

determining a plurality of simulated measurement signals associated with a simulated measurement of the one or more structures by the illuminator and detector of the metrology system based on the estimated shape of the at least one structural feature for each of the values of the one or more fabrication process parameters of the DOE set; and training a measurement model that functionally relates the plurality of simulated measurement signals to values of the one or more fabrication process parameters.

19. The metrology system of claim 18, further comprising:

generating a plurality of reduced dimension measurement signals based on an application of a transformation model to the plurality of actual measurement signals; and estimating the one or more process parameter values based on an application of the trained measurement model to the plurality of reduced dimension measurement signals.

* * * * *